United States Patent [19]

Kukanskis et al.

[11] Patent Number: 5,620,612
[45] Date of Patent: Apr. 15, 1997

[54] METHOD FOR THE MANUFACTURE OF PRINTED CIRCUIT BOARDS

[75] Inventors: Peter Kukanskis, Woodbury; John J. Grunwald, New Haven, both of Conn.

[73] Assignee: MacDermid, Incorporated, Waterbury, Conn.

[21] Appl. No.: 518,025

[22] Filed: Aug. 22, 1995

[51] Int. Cl.⁶ .................................................. B44C 1/22
[52] U.S. Cl. .................................. 216/18; 216/41
[58] Field of Search .................... 216/17, 18, 39, 216/41, 78, 105; 427/97, 98; 29/852

[56] References Cited

U.S. PATENT DOCUMENTS

| | | |
|---|---|---|
| 3,269,861 | 8/1966 | Schneble et al. ............... 216/18 |
| 3,457,638 | 7/1969 | Johnson ........................ 216/18 |
| 4,608,275 | 8/1986 | Kukanskis et al. . |
| 4,684,560 | 8/1987 | Minten et al. . |
| 4,863,758 | 9/1989 | Rhodenizer et al. . |
| 4,876,117 | 10/1989 | Akahoshi et al. . |
| 4,897,118 | 1/1990 | Ferrier et al. . |
| 4,931,148 | 6/1990 | Kukanskis et al. . |
| 4,976,990 | 12/1990 | Bach et al. . |
| 5,032,427 | 7/1991 | Kukanskis et al. . |
| 5,235,139 | 8/1993 | Bengston et al. . |
| 5,362,334 | 11/1994 | Adams et al. . |

FOREIGN PATENT DOCUMENTS

| | | |
|---|---|---|
| 1207631 | 10/1970 | United Kingdom . |
| 1259304 | 1/1972 | United Kingdom . |
| 9326145 | 12/1993 | WIPO . |

*Primary Examiner*—William Powell
*Attorney, Agent, or Firm*—John L. Cordani

[57] ABSTRACT

The present invention relates to a process for the manufacture of printed circuit boards. The method contemplates a novel processing sequence for this manufacturing process which method is particularly versatile in reducing the number of steps and variety of chemicals currently necessary to produce the circuit boards.

8 Claims, No Drawings

METHOD FOR THE MANUFACTURE OF PRINTED CIRCUIT BOARDS

FIELD OF THE INVENTION

The present invention relates to a process for the manufacture of double-sided and multi-layer printed circuit boards. The method proposed contemplates a specific manufacturing sequence and the use of electroless nickel for providing the necessary interconnections for building the circuitry to the desired thickness. The method is particularly versatile in reducing the number of steps and variety of chemicals currently necessary to produce these circuit boards.

BACKGROUND OF INVENTION

In the manufacture of printed circuit boards, it is now commonplace to produce printed circuitry on both sides of a planar rigid or flexible insulating substrate. Of increased importance is the manufacture of multi-layer printed circuits which consist of parallel, planar, alternating inner layers of insulating substrate material and conductive metal. The exposed outer sides of the laminated structure are provided with circuit patterns, as with double-sided boards, and the inner layers themselves may contain circuit patterns.

In double-sided and multi-layer printed circuit boards, it is necessary to provide conductive interconnection between and among the various layers and/or sides. This is commonly achieved by providing copper plated through-holes. Copper is provided in various ways such as by electroless or electrolytic deposition or combinations thereof.

In terms of providing the desired circuit pattern on the board, the art has developed a variety of manufacturing sequences, many of which fall into the broad categories of subtractive or additive techniques. Common to the subtractive processes is the need to etch away (or subtract) metal to expose the desired circuit patterns. Additive processes, on the other hand, begin with clean dielectric substrate surfaces and build up thereon metallization in desired areas only, the desired areas being those not masked by a previously applied pattern of plating resist material. While avoiding the problems associated with the etching required in subtractive processes, additive processes have their own inherent difficulties in terms of the choice of resist materials, the ability to build up the full metallization thickness desired by electroless methods, the relatively long time periods required to electrolessly build the desired thickness' and weaknesses in the physical properties of most electroless copper, deposits.

U.S. Pat. No. 4,897,118 (Ferrier et. al), whose teachings are incorporated herein by reference, reveals a process for selective metallization of a substrate in a predetermined desired pattern (i.e. additive technology). Ferrier et. al. discussed additive technology, proposed certain improvements thereto, and give a fair picture of the current state-of-the-art in this area. The current invention proposes improvements thereto which provide significant advantages in reducing the number of steps and chemicals involved in the fabrication thereby making the fabrication process more economical and feasible.

The prior art additive processes suffered from a variety of problems. Firstly, most plating masks currently used in the industry are strippable in alkaline solutions. Electroless copper baths are invariably alkaline, usually very alkaline, with pH's in excess of 12. Therefore, known plating resists have great difficulty in maintaining their integrity and adhesion to the board surface when subjected to plating in electroless copper baths, particularly when the long plating periods required by these techniques (8 to 24 hours) are taken into consideration. When the plating mask loses its integrity and/or adhesion to the surface, circuit definition fails. As one possible solution to this problem see U.S. Pat. No. 4,876,177 (Akahoshi et al.), the teachings of which are incorporated herein by reference, where the organic resist undergoes its final curing after chemical copper plating.

Many alternate techniques have been developed to additively and semi-additively produce circuit boards. As one such technique, Kukanskis et al. (U.S. Pat. No. 4,931,148), the teachings of which are incorporated herein by reference, reveals a process whereby an organic resist is used to pattern the surface of the printed circuit. The entire surface is subsequently activated then the resist surfaces are deactivated by the application of an alkaline solution. Plating then occurs chemically in the desired pattern. A second alternative is proposed in PCT patent application No. 9326145 (Knopp), the teachings of which are incorporated herein by reference. Knopp reveals a process for the production of printed circuit boards whereby circuits are etched, holes are drilled, then a removable "desense" mask is applied. The printed circuit board is then activated, the "desense" mask removed, and then the holes and circuit features are plated. For additional alternative methods see British Patent No. 1,259,304 (Photocircuits Corporation) and British Patent No. 1,207,631 (Technograph Limited), the teachings of which are incorporated herein by reference.

The current application proposes a new method for semi-additively producing printed circuit boards. The process proposed improves upon prior methods in several ways including reduction of processing steps and ease of use.

SUMMARY OF THE INVENTION

The present invention proposes an improved process for the manufacture of printed circuit boards. The method provides various advantages over the prior art, including reduced number of cycle steps, reduced number and types of necessary chemical treatments and increased manufacturing efficiency. This method thus overcomes many difficulties experienced with prior methods, particularly by providing a workable process for the production of printed circuit boards without the need for electroplating.

The method currently proposed contemplates a specific manufacturing sequence for the production of printed circuit boards in combination with electroless plating for building circuitry to thickness. The most preferred form of electroless plating in this application is electroless nickel. The following basic production cycle is proposed for implementation of this invention:

1. Drill or punch the desired holes in copper clad laminate or multilayer package;
2. Activate holes; thereafter
3. Optionally, electrolessly plate the holes and surfaces with a thin layer of electroless metal; thereafter
4. Apply an imaged etch resist; thereafter
5. Etch exposed copper to form circuits and other surface features; thereafter
6. Strip the etch resist; thereafter
7. Optionally, apply an imaged plating mask; thereafter
8. Optionally, initiate plating (electroless copper or electroless nickel); thereafter 9. Electroless Plate to desired thickness (additive electroless copper or electroless nickel-phosphorous ); thereafter
10. Optionally, strip plating mask; thereafter
11. Optionally, final finish; thereafter Various optional steps may be added to this basic cycle to suit the particular needs of the fabricator. As used herein, and in the claims, copper clad laminate shall include multilayer circuitry packages as well as double sided circuitry packages.

DETAILED DESCRIPTION OF THE INVENTION

The present method is an improvement upon the semi-additive techniques for production of printed circuits. As such the invention addresses many of the concerns and problems experienced by past techniques through the use of a specific processing sequence. The processing sequence proposed allows for the process to operate without the need for a de-sensitizing mask which is usually applied before activation and stripped after activation (see Knopp for a relevant discussion of desensitizing masks).

The present invention proposes the following basic cycle for the production of double-sided and multilayer printed circuit boards:

1. Drill or punch the desired holes in copper clad laminate or multilayer package
2. Activate holes
3. Optionally, electrolessly plate the holes and surfaces with a thin layer of electroless metal
4. Apply an imaged etch resist
5. Etch exposed copper to form circuits and other surface features
6. Strip the etch resist
7. Optionally, apply an imaged plating mask
8. Optionally, initiate plating (electroless copper or electroless nickel)
9. Electroless Plate to desired thickness (additive electroless copper or electroless nickel-phosphorous)
10. Optionally, strip plating mask
11. Optionally, final finish The first step calls for the copper clad laminate or multilayer package to be drilled or punched with holes or vias. Thus, holes will penetrate through the entire board. Vias may penetrate through one side of the board into the interior of the board but not through to the other side.

Next, the holes are activated to accept plating. Activation of the holes can range in complexity from a single dip in a previous metal activator (or other non-precious metal activators known in the art) to a full DESMEAR (or etch back) plated through-hole cycle involving numerous steps. The most complex hole activation cycle might consist of hole condition (m-Pyrol), potassium permanganate desmear, neutralization (acid/reducer), glass etch (Ammonium Bifluoride), conditioner (surfactant or other type), microetch, activator ($PdCl_2$/$SnCl_2$ Colloid) and accelerator. Clean water rinses are interposed between each chemical treatment. Various combinations will be apparent to those skilled in the art. Regardless of which hole activation cycle is chosen, its primary purpose is to treat the holes so that the hole surfaces will initiate plating. A wide variety of methods for achieving this are known in the art, any of which may be advantageously be utilized here. Please refer to U.S. Pat. Nos. 5,032,427 (Kukanskis et al.), U.S. Pat. No. 4,976,990 (Bach et al.), U.S. Pat. No. 4,608,275 (Kukanskis et al.) and U.S. Pat. No. 4,863,758 (Rhodenizer), the teachings all of which are incorporated herein by reference in their entirety. As an alternative the holes may be activated to directly accept electrolytic plating (ie. direct plate techniques) as described for example in U.S. Pat. No. 4,684,560 (Minten et al.), the teachings of which are incorporated by reference.

Optionally, after activation the holes may be plated with a thin layer of metal, most preferably by electroless means. If the holes are optionally plated at this point it is most advantageous to cover or tent over the ends of the holes (or plug the holes) with the etch resist so that the thinly metallized holes are not subjected to the etching solution. The advantage of opting to thinly plate the holes at this stage is to make their platability, after the etching of the circuitry, more reliable.

After activation, an etch resist is applied to the surfaces of the copper clad laminate. Etch resist can take one of several forms, including dry film and liquid photopolymers. The etch resists are applied, imaged and developed such that a positive image of the circuitry and other surface features to be formed is created. Preferably the etch resist covers or tents the openings of the holes or plugs the holes in order to assist in the preservation of the activator film on the hole wall surfaces.

The next step involves etching the exposed copper thereby allowing the resist covered copper to stand out in vertical relief. The circuits and other surface features are thereby formed. The etchant can be any one of a variety of etchants including alkaline ammoniacal copper chloride, acidic copper chloride, peroxide sulfuric and the like. Preferably the etchant used will not disturb the activator film on the surfaces of the hole wall, particularly if the ends of the holes are not tented, or covered or plugged.

The etch resist is then stripped away, usually with an alkaline or solvent based solution.

At this point, the outer surfaces of the double-sided or multilayer circuitry are optionally coated with a plating mask. The plating mask can be applied in several ways including dry film, roller coating, curtin coating, screening, or various similar techniques. Generally the plating mask is imaged so that the areas to be subsequently plated are not covered and the plating mask covers all other areas of the surface. The plating mask can be imaged in various ways including screening, photoimaging followed by development, or similar techniques. Finally the plating mask is cured either by application of heat, photoradiation or both. Compositions and methods of application of plating masks are well known in the art. Application of a plating mask at this point is advantageous in providing for additional or enhanced definition of the plated features.

The next step is to optionally initiate plating in the holes and possibly upon the areas of connection. This initiation can occur in several ways. One preferred example is through the application of electroless copper. Another is through the application of electroless nickel-boron. Either of these solutions will initiate plating upon the activated areas only. Thus, only the holes and other areas not covered by the plating mask will be plated. It has been discovered that initiation of plating can be made directly through the use of electroless nickel phosphorous in this case. This is possible because the surface features have been etched on the surface prior to this stage. If electroless nickel-phosphorous is used it is preferable to continue to build the entire required thickness with the electroless nickel-phosphorous solution. It is most advantageous to utilize a "high phosphorous" nickel-phosphorous bath which deposits nickel with 10% or greater phosphorous content.

The next step could be a continuation of the previous step, or, it could be a separate step as indicated on the former sequence. The object of this step is to plate the holes and other uncovered areas to the appropriate metal thickness. Thus, if an appropriate electroless copper is used in the previous step, the board could be left in the electroless copper for an extended time to build the appropriate thickness of copper. One preferred method, however is to initiate plating in the previous step with electroless copper (10 to 150 microinches of copper) and then to follow that initiation with either electroless nickel phosphorous or a strike of electroless nickel-boron followed by electroless nickel-phosphorous. It is most preferable, however, to accomplish all of the plating in a single electroless nickel, preferably electroless nickel-phosphorus, plating step.

After plating is complete, if a plating mask was used, it is then stripped. The stripping process will depend upon the particular plating mask used, however, many plating masks strip in alkaline solution. Application of the stripping solution may be by spray, flood, immersion or other similar means.

The final step is optional, but recommended. This step consists of applying some form of final finish to the holes and other areas of connection. These final finishes have as their objective, the protection and/or enhancement of the solderability of these surfaces. A final finish may take one of many forms. It may consist of an organic treatment which preserves and enhances the solderability of these surfaces, such as is described in U.S. Pat. No. 5,362,334 (Adams et al.) the teachings of which are incorporated herein by reference in their entirety. Alternatively it may consist of a series of metallic treatments, possibly culminating in a precious metal coating as described in U.S. Pat. Nos. 5,235,139, the teachings of which are incorporated herein by reference in their entirety.

Various additional steps may be inserted between the steps of the proposed process sequence. In addition, substitutions may also be made. These insertions or substitutions may be such as would be obvious to one skilled in the art.

This invention is further described in the following examples which are given for illustrative purposes only, and are in no way limiting.

EXAMPLE 1

A printed circuit board was fabricated in the following manner according to the teachings of this invention:
1. Holes are drilled through a sized piece of copper clad laminate in the desired array.
2. The holes were activated to accept and initiate plating on their surface by subjecting the boards to the following treatments:
   a. Cleaner/conditioner (MacDermid 9420) for four minutes at 110° F. by immersion therein.
   b. Activation (MacDermid Mactivate 10) for four minutes at 110° F. by immersion therein.
   * Rinsing is provided between steps.
3. The copper clad laminate was coated with a dry film etch resist on both copper surfaces. The etch resist was then exposed, imaged and developed so that the etch resist covered only those areas of copper which were to remain (in the alternative the etch resist could have been screened onto the surface in an imagewise fashion). The laminate was then subjected to etching whereby the circuits were defined by etching away all exposed copper. The etch resist was then stripped away.
4. A dry film plating mask was then laminated over the surfaces of the laminate. The plating mask was then exposed, imaged and developed such that it represented the negative image of the desired circuitry and features (in the alternative the plating mask could have been screened onto the surface in an imagewise fashion).
5. The plating was initiated by immersing the boards in MacDermid M-85 electroless copper bath for fifteen minutes at 115° F. A total of 100 microinches of electroless copper was plated. Plating occurred only in the holes, on other areas of connection and exposed circuits. MacDermid Electroless nickel-boron bath was utilized to plate approximately two microinches of nickel-boron onto the exposed copper surfaces.
6. The boards were then plated to thickness by immersing them in MacDermid Electroless Nickel-Phosphorous solution for 180 minutes at 190° F. Approximately 1150 microinches of nickel-phosphorous was plated in the holes and on the other areas of connection.
7. The Plating Mask was then stripped in 10% caustic solution. Please note that fresh water rinses were interposed after each chemical operation given above.

EXAMPLE II

A printed circuit board was fabricated in the same manner as in Example 1, except that after Step 7 thereof the board was further processed in the following manner:
   a. The board was immersed in MacDermid 9271 cleaner to clean and activate the exposed metallic surfaces.
   b. The exposed metallic surfaces were then plated with twenty microinches of electroless palladium by immersion in MacDermid Electroless Palladium bath for twenty minutes at 160° F.

EXAMPLE III

A printed circuit board was fabricated in the same manner as in Example II, except that Step 5 was replaced by the following:
   5. The plating was initiated by immersing the boards in MacDermid Electroless Nickel-boron for one minute at 115° F. Approximately two microinches of Nickel-boron was plated in the holes and on the other areas of connection.

EXAMPLE IV

A printed circuit board was fabricated in the same manner as in Example 1 except that Step 5 was eliminated.

EXAMPLE V

A printed circuit board was fabricated in the same manner as in Example II, except that the board was a multilayer board and therefore Step 1 was modified as follows:
   1. Several sized pieces of copper clad laminate were coated with a dry film etchresist on each side. The layers were then individually exposed, imaged and developed to reveal their respective circuit patterns. The layers were then etched and the resist stripped. The layers were then laminated into a multilayer package with copper foil on both exterior surfaces and the various inner-layers in between (ie. a copper clad laminate). Holes were then drilled through the multilayer package in the desired array.

EXAMPLE VI

A printed circuit board was fabricated in the same manner as in Example V, except that the board was subject to a desmear operation after Step 2 but prior to Step 3. The desmear operation consists of the following steps:

a). Solvent Swell—(MacDermid 9204), 2 minutes, 100° F.

b). Potassium Permanganete (MacDermid 9275), 60 gr/l, 10 minutes, 160° F.

c). Neutralizer (MacDermid 9279), 110° F., 5 minutes.

*Note. Fresh water rinses were interposed between each chemical step.

The printed circuit boards in all the above examples were tested in a variety of ways including standard solder shock tests, conductivity tests, cross section tests, and various functional testing. The results of all testing revealed that all of the printed circuit boards produced, functioned acceptably, for the purposes intended.

As can be seen from the current specification, the proposed process has many advantages over the prior art processes. One of the most important advantages is that it provides an efficient method of producing printed circuit boards which substantially reduces the number of required steps and processes required. In addition, the proposed process provides a workable semi-additive approach to producing printed circuit boards.

What is claimed is:

1. A process for producing printed circuit boards, which process comprises the steps of:
   (a). forming holes in a desired array in copper clad laminate;
   (b). activating said holes to accept plating thereon; thereafter
   (c). applying an imaged etch resist;
   (d). etching any exposed copper to form circuits;
   (e). strip the etch resist;
   (f). optionally, applying an imaged plating mask;
   (g). plating the holes subsequent to the formation of the circuits;
   (h). if a plating mask is used, then stripping the plating mask.

2. A process according to claim 1, wherein step (b) comprises:
   (a) subjecting said holes to a conditioning agent which enhances the ability to activate and plate said holes; and
   (b) thereafter subjecting said holes to an activator which enhances the platability of said holes.

3. A process according to claim 1 wherein step (c) comprises:
   (a) coating the exterior surfaces of the copper clad laminate with an etch resist; and
   (b) imaging and developing said etch resist such that the etch resist forms a positive image of the desired circuitry.

4. A process according to claim 1 wherein step (g) comprises:
   (a) subjecting said holes to electroless nickel-boron plating; and
   (b) thereafter subjecting said holes to electroless nickel-phosphorous plating.

5. A process according to claim 1 wherein step (g) comprises subjecting said holes to an electroless plating bath selected from the group consisting of electroless nickel-phosphorous and electroless copper.

6. A process according to claim 1 wherein step (g) comprises:
   (a) subjecting said holes to electroless copper plating;
   (b) thereafter subjecting said holes to electroless nickel-boron plating; and
   (c) thereafter subjecting said holes to electroless nickel-phosphorous plating.

7. A process according to claim 1 wherein after step (h) the boards are subjected to a final finish process comprising a process selected from the group consisting of applying an organic coating which enhances the solderability of the holes and other areas of connection, plating the holes and other areas of connection with a precious metal, plating the holes and other areas of connection with nickel followed by plating said holes and other areas of connection with a precious metal, and combinations thereof.

8. A process according to claim 3 wherein the etch resist covers the ends of the holes after development.

* * * * *